United States Patent
Liu (10) Patent No.: US 7,512,910 B2
(45) Date of Patent: *Mar. 31, 2009

(54) INTEGRATED CIRCUIT DESIGN USING CHARGE PUMP MODELING

(75) Inventor: Mitch Liu, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 499 days.

This patent is subject to a terminal disclaimer.

(21) Appl. No.: 11/300,034

(22) Filed: Dec. 14, 2005

(65) Prior Publication Data

US 2006/0106589 A1    May 18, 2006

Related U.S. Application Data

(63) Continuation of application No. 10/375,427, filed on Feb. 27, 2003, now Pat. No. 7,007,255.

(51) Int. Cl.
*G06F 17/50* (2006.01)

(52) U.S. Cl. .............................................. 716/3; 716/4

(58) Field of Classification Search ...................... 716/3, 716/4, 3.4
See application file for complete search history.

(56) References Cited

U.S. PATENT DOCUMENTS

| | | | |
|---|---|---|---|
| 5,335,200 A | 8/1994 | Coffman et al. | |
| 5,604,671 A | 2/1997 | Okamura | |
| 5,994,949 A | 11/1999 | Menichelli | |
| 6,075,406 A | 6/2000 | Lee et al. | |
| 6,078,212 A | 6/2000 | Lakhani | |
| 6,281,758 B1 | 8/2001 | Elsayed et al. | |
| 6,339,350 B1 | 1/2002 | Tanaka | |
| 6,356,796 B1 * | 3/2002 | Spruiell et al. | ................. 700/97 |
| 6,407,619 B1 | 6/2002 | Tanaka | |
| 6,535,052 B2 | 3/2003 | Myono | |
| 7,076,415 B1 * | 7/2006 | Demler et al. | ................. 703/14 |
| 2002/0114417 A1 | 8/2002 | McDonagh | |

* cited by examiner

*Primary Examiner*—Jack Chiang
*Assistant Examiner*—Brandon W Bowers
(74) *Attorney, Agent, or Firm*—Leffert Jay & Polglaze, P.A.

(57) ABSTRACT

Circuit models for the simulation of charge pumps facilitate design of integrated circuits containing charge pumps. Such models facilitate accurate simulation of actual charge pump behavior without the need to rigorously simulate the multiple capacitive stages of an actual charge pump and the dedicated oscillator clocking the charge pump. The various embodiments utilize a charge pump model having multiple pull-up stages. At lower output voltages, the pull-up stages each provide an output current. These output currents are added together as the output current of the charge pump. Each pull-up stage automatically shuts off when the output voltage approaches a dedicated voltage source for that pull-up stage. As the output voltage increases, less current is output due to the deactivation of pull-up stages.

23 Claims, 4 Drawing Sheets

INTEGRATED CIRCUIT DESIGN USING CHARGE PUMP MODELING

RELATED APPLICATION

This application is a Continuation of U.S. patent application Ser. No. 10/375,427, filed Feb. 27, 2003 now U.S. Pat. No. 7,007,255 and titled, "INTEGRATED CIRCUIT DESIGN USING CHARGE PUMP MODELING", which is commonly assigned and incorporated by reference herein in its entirety.

TECHNICAL FIELD OF THE INVENTION

The present invention relates generally to design of integrated circuit devices and, in particular, using charge pump modeling to facilitate design of integrated circuit devices incorporating charge pumps.

BACKGROUND OF THE INVENTION

As electronic components and electronic systems have become more complex, the design of these components and systems has become a more time consuming and demanding task. Software simulation of electronic components and systems has become an important tool for designers. Simulation of a design is the execution of an algorithm that models the behavior of the actual design. Simulation provides the ability to analyze and verify a design without actually constructing the design and has many benefits in the design process. However, rigorous simulation can lead to undesirably long simulation run times.

Flash memory is being incorporated into a wide range of applications such as computer BIOS (Basic Input/Output System) chips, electronic film for digital cameras, memory cards for video game systems, and memory in wireless communications devices. Flash memory cells are generally floating-gate transistors. The data value of such cells is determined by the amount of charge stored on its floating gate. Programming and erasing flash memory cells is generally accomplished using voltages having a higher magnitude than a supply potential. These voltages are often generated internally to the flash memory device using charge pumps. Although charge pumps are complicated to model, charge pumps are popular because of their consumption of little power when in shutdown mode and their relatively small layout requirement.

Charge pump models are used to aid the design of memory devices or other integrated circuits utilizing charge pumps. Conventional charge pump models used in the simulation are limited by the speed of the simulation and limited by complex or inaccurate model representations. To simplify simulation, common resistive load voltage sources may be used to emulate actual charge pump behavior, but this does not address the non-linearity of an actual charge pump in which the output current diminishes with increasing magnitude of its voltage output.

Sophistication in the charge pump model is a cause of delay in design simulation. When the simulation is run, rigorous charge pump models can contribute to long analog simulation times. Therefore, for the reasons stated above, and for other reasons stated below which will become apparent to those skilled in the art upon reading and understanding the present specification, there is a need in the art for alternative methods of modeling charge pump behavior in the design of integrated circuit devices.

SUMMARY OF THE INVENTION

The above-mentioned problems and other problems are addressed by the present invention and will be understood by reading and studying the following specification.

The various embodiments assist designers in the development of integrated circuit designs utilizing charge pumps. Examples may include memory devices and memory systems. The various embodiments facilitate accurate simulation of actual charge pump behavior without the need to rigorously simulate the multiple capacitive stages of an actual charge pump and the dedicated oscillator clocking the charge pump. The various embodiments provide better circuit approximations for the charge pump in comparison to the conventional resistive load voltage source circuit models. The various embodiments further facilitate reduced simulation run times when compared with more complex models.

The various embodiments utilize a charge pump model having multiple pull-up stages. At lower output voltages, the pull-up stages each provide an output current. These output currents are added together as the output current of the charge pump. Each pull-up stage automatically shuts off when the output voltage approaches a dedicated voltage source for that pull-up stage. As the output voltage increases, less current is output due to the deactivation of pull-up stages. Thus, the non-linearity in which the current diminishes with voltage output is represented. In the design of an integrated circuit incorporating a charge pump, e.g., a memory device, such modeling will facilitate accurate response of the integrated circuit to the charge pump output without resorting to a more rigorous simulation of the actual charge pump circuitry.

For one embodiment, the invention provides a method of designing an integrated circuit having a charge pump. The method includes simulating an output of the charge pump using a circuit model, wherein the model comprises a plurality of pull-up stages coupled in parallel to generate the output current of the charge pump, wherein each pull-up stage is adapted to automatically deactivate itself when a voltage level of the simulated output current of the charge pump approaches a threshold value associated with that pull-up stage.

For another embodiment, the invention provides a method of designing an integrated circuit device through analog circuit simulation. The method includes simulating the integrated circuit device using one or more circuit models, wherein at least one of the circuit models is a charge pump model. The charge pump model includes a first pull-up stage coupled to an output of the charge pump model and a second pull-up stage coupled to the output of the charge pump model in parallel with the first pull-up stage. The first pull-up stage is adapted to provide a first output current while an output voltage at the output of the charge pump model is below a first value and to deactivate the first output current while the output voltage at the output of the charge pump model is above the first value. The second pull-up stage is adapted to provide a second output current while the output voltage at the output of the charge pump model is below a second value and to deactivate the second output current while the output voltage at the output of the charge pump model is above the second value. The first output current and the second output current are combined at the output of the charge pump model. The second value of the output voltage is different than the first value of the output voltage.

The invention further provides methods of varying scope.

DETAILED DESCRIPTION OF THE INVENTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
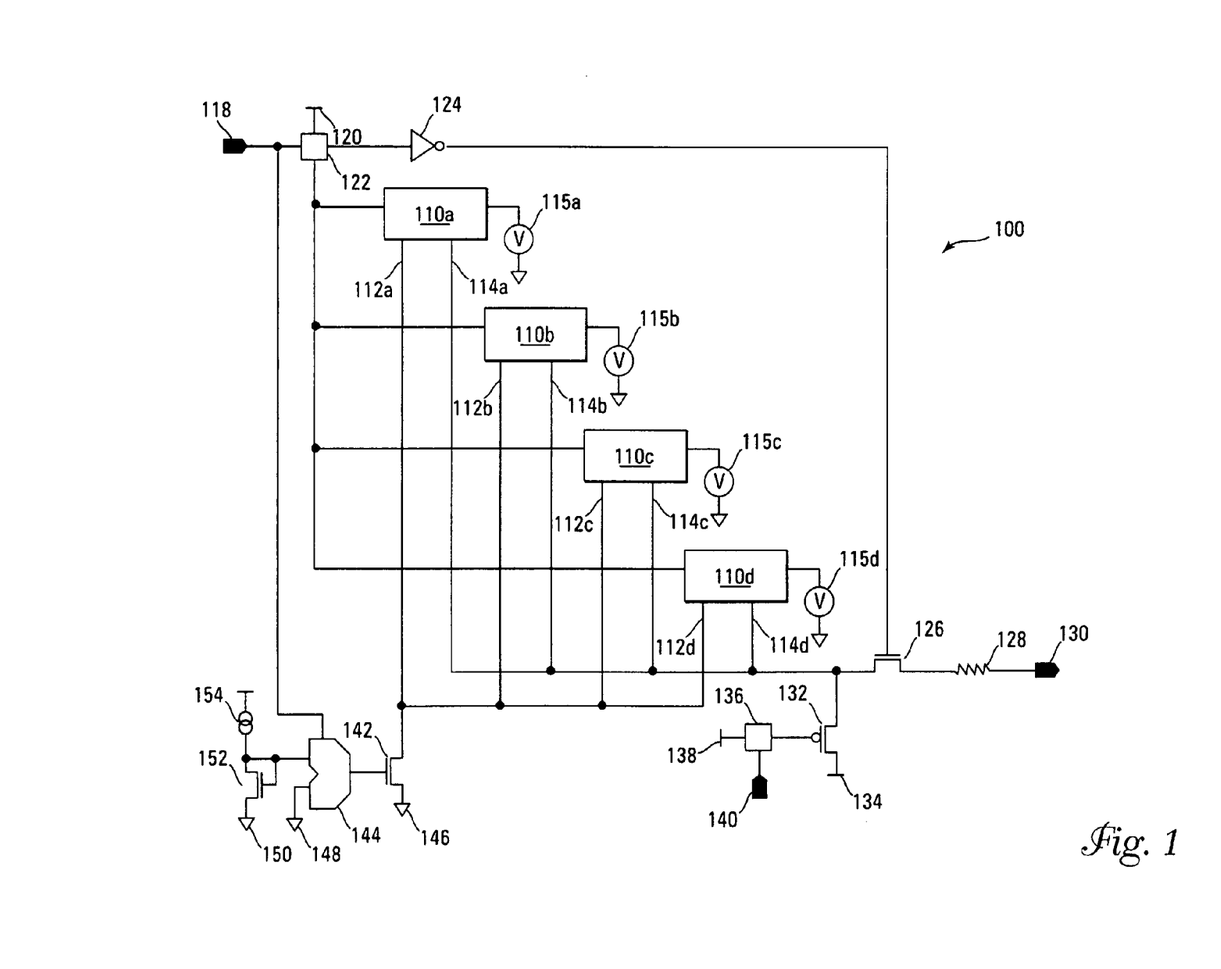
FIG. 1 is a block schematic of a charge pump model in accordance with an embodiment of the invention.

A block schematic of a charge pump model 100 in accordance with an embodiment of the invention is depicted in FIG. 1. The charge pump model 100 includes two or more current pull-up stages 110 coupled in parallel. The current pull-up stages 110 are adapted to provide an output current on an output branch 114 until an output voltage reaches a predetermined threshold value, as described below. For one embodiment, each current pull-up stage 110 is a current mirror having a reference branch 112 and the output branch 114.

In the example of FIG. 1, the charge pump model 100 includes four current mirrors 110a-d. Each current mirror 110a-d has a reference branch 112a-d, respectively, coupled between a voltage source 115a-d, respectively, and a ground node 146. The ground node 146 is coupled to receive a ground potential, e.g., Vss. Each current mirror 110a-d further has an output branch 114a-d, respectively, coupled between the voltage source 115a-d, respectively, and an output node 130.

Operation of the current mirrors 110a-d can be controlled in response to a control signal received from a switch 122. The switch 122 is coupled to a supply node 120. The supply node 120 is coupled to receive a supply potential, e.g., Vpp. The switch 122 is adapted to selectively couple the supply node 120 to either a first output of the switch 122 coupled to the current mirrors 110a-d or a second output of the switch 122 coupled, in this embodiment, to an inverter 124. The switch 122 is controlled in response to a control signal from node 118. If node 118 is coupled to receive a first logic level, the first output of the switch 122 is coupled to the supply node 120 representing a first logic level and the second output of the switch is coupled to receive a ground potential representing a second logic level. If node 118 is coupled to receive a second logic level, the first output of the switch 122 is coupled to receive the ground potential and the second output of the switch 122 is coupled to the supply node 120.

Each voltage source 115 is preferably independent of other voltage sources 115. For one embodiment, the voltage of each voltage source 115 has the following relationship: $V_{115a} > V_{115b} > V_{115c} > V_{115d}$. For a further embodiment, $V_{115a}$ is approximately 9.5V, $V_{115b}$ is approximately 9V, $V_{115c}$ is approximately 7V and $V_{115d}$ is approximately 5V.

Figure 2:
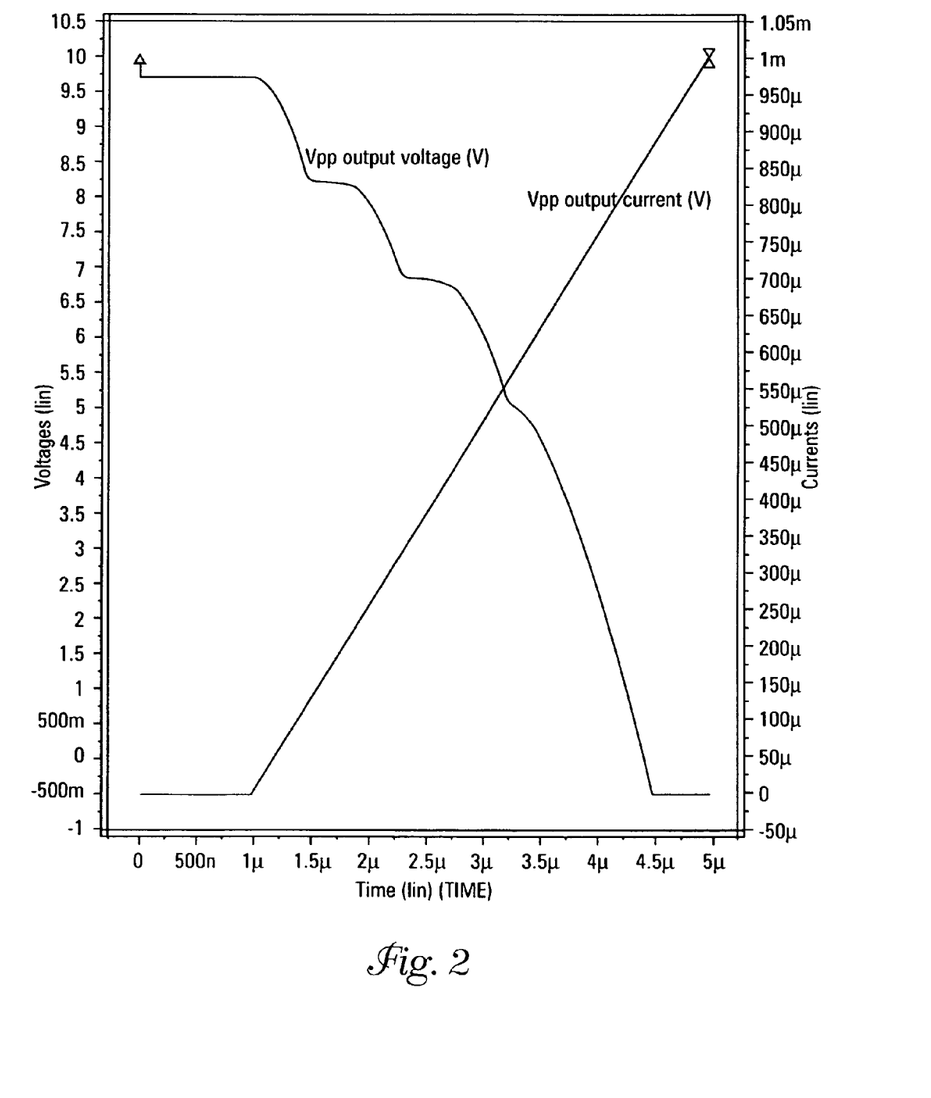
FIG. 2 is a graph of the expected relationship between output current and output voltage for a charge pump model of the type depicted in FIG. 1.

By defining the voltages of the voltage sources 115 to be different from each other, the current mirrors 110 can be successively deactivated in response to an increasing voltage level on the output node 130. For example, using the foregoing example Of $V_{115a} > V_{115b} > V_{115c} > V_{115d}$, as the voltage on the output node increases and approaches the voltage of the voltage source 115d, the output current from current mirror 110d will drop to zero, i.e., the current mirror 110d will no longer contribute to the output current of output node 130. As the voltage on the output node 130 continues to increase, it will approach the voltage of the voltage source 115c, thus removing the contribution of current mirror 110c to the output current of output node 130. In similar fashion, further increases in voltage will remove the contributions of current mirrors 110b and 110a as the voltage on the output node 130 approaches the voltage of voltage sources 115b and 115a, respectively. In this manner, the behavior of a charge pump, i.e., decreasing output current in response to increasing output voltages, is simulated. However, while an actual charge pump will exhibit a substantially continuous increase in output voltage over time, the current model 100 is expected to exhibit something of a discrete stepwise increase in output voltage. FIG. 2 is a graph of the expected relationship between output current and output voltage for a charge pump model of the type depicted in FIG. 1.

It should be apparent that increasing the number of parallel-connected current mirrors 110 will decrease the granularity of the discrete increases in output voltage, thus improving its simulation of charge pump behavior. However, increasing numbers of current mirrors 110 will result in increased simulation run times. For one embodiment, the charge pump model 100 includes between three and six current mirrors 110.

A non-linear relationship between the voltages of the voltage sources 115 can be used to approximate a non-linear relationship between the output current and output voltage of a charge pump. For example, smaller differences between the voltages of the voltage sources 115 will result in quicker declines in the output current while larger differences in voltage will result in slower declines in output current.

The output branches 114a-d may be selectively coupled to the output node 130 using a switch 126, such as an n-channel field-effect transistor (nFET). The nFET 126, for one embodiment, has a gate coupled to receive a control signal from the switch 122 through the inverter 124. A resistive load 128 further may be interposed between the output node 130 and the output branches 114a-d.

The reference branches 112a-d may be selectively coupled to the ground node 146 using a switch 142, such as an nFET. The nFET 142 has a gate coupled to receive a control signal from a multiplexer 144. While only one nFET 142 is depicted in FIG. 1, each reference branch 112a-d may be selectively coupled to the ground node 146 through a separate nFET or other switching device.

The multiplexer 144 is coupled to receive a control signal, e.g., from node 118, to select between a first input when the control signal has the first logic level and a second input when the control signal has the second logic level. The first input of the multiplexer 144 is coupled to a current source 154. An nFET 152 having a first source/drain region coupled to the first input of the multiplexer 144 and the current source 154, a gate coupled to its first source/drain region, and a second source/drain region 150 can be used to control the voltage level seen at the first input of the multiplexer 144. The second input of the multiplexer 144 is coupled to the ground node 148.

The charge pump model 100 can be deactivated by the application of the second logic level at node 118. As will be described in more detail later, coupling the current mirrors 110a-d to the ground potential at switch 122 will deactivate the current mirrors 110a-d. Additionally, a control signal having the second logic level at node 118 will couple the gate of the nFET 142 to the ground node 148, thus deactivating it and eliminating the current drain to the ground node 146. To bias the current mirrors 110a-d, the output branches 114a-d may be selectively coupled to a supply node 134 through a p-channel field-effect transistor (pFET) 132. The pFET 132 has its gate coupled to a switch 136. Similar to switch 122, switch 136 selectively couples a supply node 138 or a ground potential to the gate of the pFET 132 in response to a control signal received at node 140. During operation, node 140 would generally have the same logic level as node 118. However, nodes 140 and 118 may operate independently. During deactivation of the charge pump model 100, it is preferable to couple the output branches 114a-d to the supply node 134 when the output branches 114a-d are isolated from the output node 130 and when the reference branches 112a-d are isolated from the ground node 146.

Figure 3:
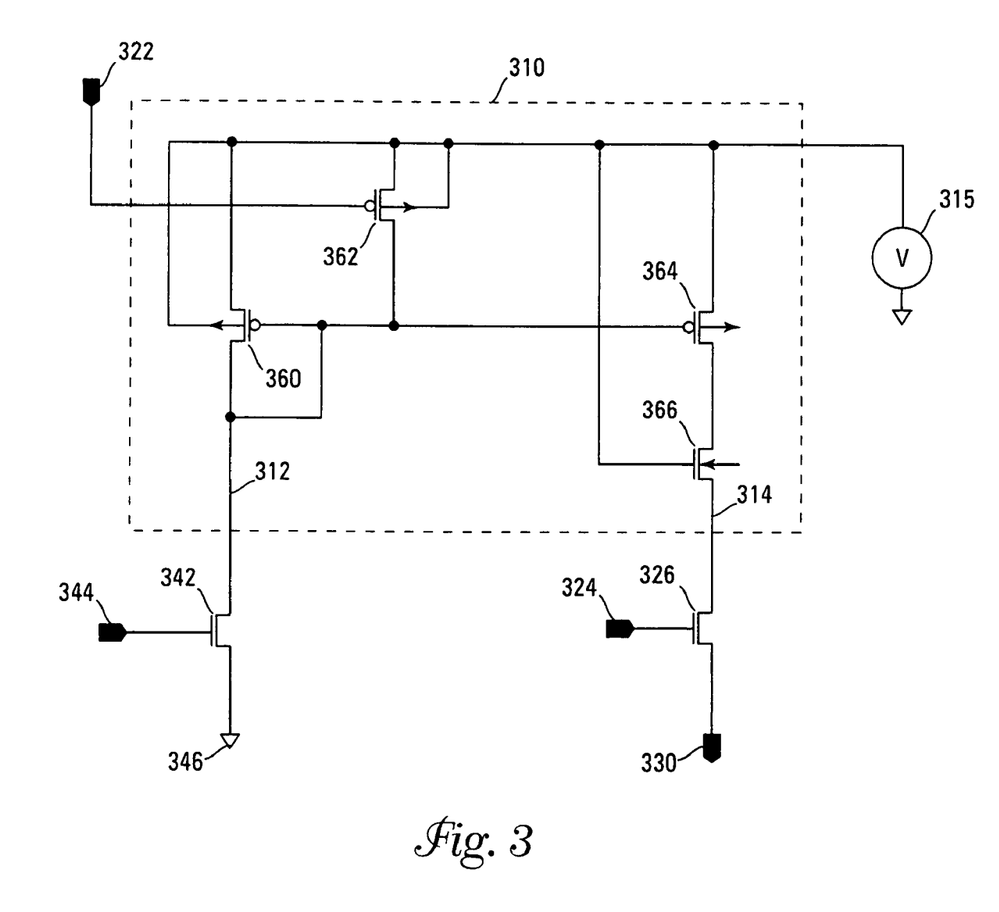
FIG. 3 is a schematic of a current mirror in accordance with an embodiment of the invention for use with a charge pump model of the type depicted in FIG. 1.

A schematic of one example of a current mirror 310 for use with embodiments of the invention is depicted in FIG. 3. The current mirror 310 includes a reference branch 312 and an output branch 314. For one embodiment, the reference branch 312 corresponds to one of the reference branches 112a-d of FIG. 1 and the output branch 314 corresponds to one of the output branches 114a-d, respectively. The current mirror 310 further includes a first p-channel field-effect transistor (pFET) 360 having a first source/drain region coupled to the reference branch 312, a second source/drain region coupled to the voltage source 315, and a gate coupled to its first source/drain region. A second pFET 362 has a gate coupled to a node 322, e.g., the first output of the switch 122 of FIG. 1, a first source/drain region coupled to the gate of the pFET 360, and a second source/drain region coupled to the voltage source 315.

The current mirror 310 further includes a third pFET 364 having a gate coupled to the gate of the first pFET 360 and the first source/drain region of the pFET 362, a first source/drain region, and a second source/drain region coupled to the voltage source 315. A first n-channel field-effect transistor (nFET) 366 has a gate coupled to the voltage source 315, a first source/drain region coupled to the output branch 314, and a second source/drain region coupled to the first source/drain region of the pFET 364.

In operation of the current mirror 310, with reference to FIGS. 1 and 3, a logic 1 is applied to the gate of the pFET 362 to isolate the gate of pFET 360 from the voltage source 315, the reference branch 312 is coupled to the ground node 146 and the output branch 314 is coupled to the output node 130. The current flow through the pFET 360 will be mirrored through the pFET 364. As the voltage on the output branch 314 increases, the VGS of the nFET 366 will fall below its threshold voltage, thereby deactivating nFET 366 and removing the output current from the output branch 314. By adjusting the sizing of the pFET 364, the output current on the output branch 314 can be adjusted. This is another tool by which the various embodiments can be modified to more closely track the behavior of an actual charge pump.

For one embodiment, the node 322 for each current mirror 310 is coupled to selectively receive a supply potential of approximately 11 V. For a further embodiment, in each current mirror 310, the pFET 360 has a W/L ratio of approximately 10/5, the pFET 362 has a W/L ratio of approximately 20/5 and the nFET 366 has a W/L ratio of approximately 300/2. To further this embodiment, the W/L ratio of the pFETs 364 is varied to produce different output currents from each current mirror 310. For one embodiment, the pFET 364 of a first current mirror 310 has a W/L ratio of approximately 200/5 and is coupled to a voltage source 315 having a voltage of approximately 11.5V for producing an output current of approximately 200 µA when active. For a further embodiment, the pFET 364 of a second current mirror 310 has a W/L ratio of approximately 100/5 and is coupled to a voltage source 315 having a voltage of approximately 9V for producing an output current of approximately 100 µA when active. For a still further embodiment, the pFET 364 of a third current mirror 310 has a W/L ratio of approximately 150/5 and is coupled to a voltage source 315 having a voltage of approximately 7V for producing an output current of approximately 150 µA when active. For a still further embodiment, the pFET 364 of a fourth current mirror 310 has a W/L ratio of approximately 200/5 and is coupled to a voltage source 315 having a voltage of approximately 5V for producing an output current of approximately 200 µA when active.

As noted above, the charge pump model 100 can be utilized in the simulation of charge pumps for the design of integrated circuit devices. One example of an integrated circuit device is a memory device, such as the memory device 400 of FIG. 4. In the design of integrated circuit devices, it is common to simulate the behavior of the device using a computer program. One common family of simulation programs includes those based on SPICE. SPICE is a general-purpose analog circuit simulator that is used to verify circuit designs and to predict circuit behavior. SPICE was originally developed at the Electronics Research Laboratory of the University of California, Berkeley in 1975 and is well known and accepted in the art for the purpose of predicting circuit behavior. By simulating the behavior of an integrated circuit device, modifications and improvements can be made prior to fabrication. The various embodiments facilitate improved simulation run times over simulations utilizing more rigorous charge pump models while not sacrificing the ability to model the inverse relationship between the output current and the output voltage, something that simple resistive load models cannot mimic.

Figure 4:
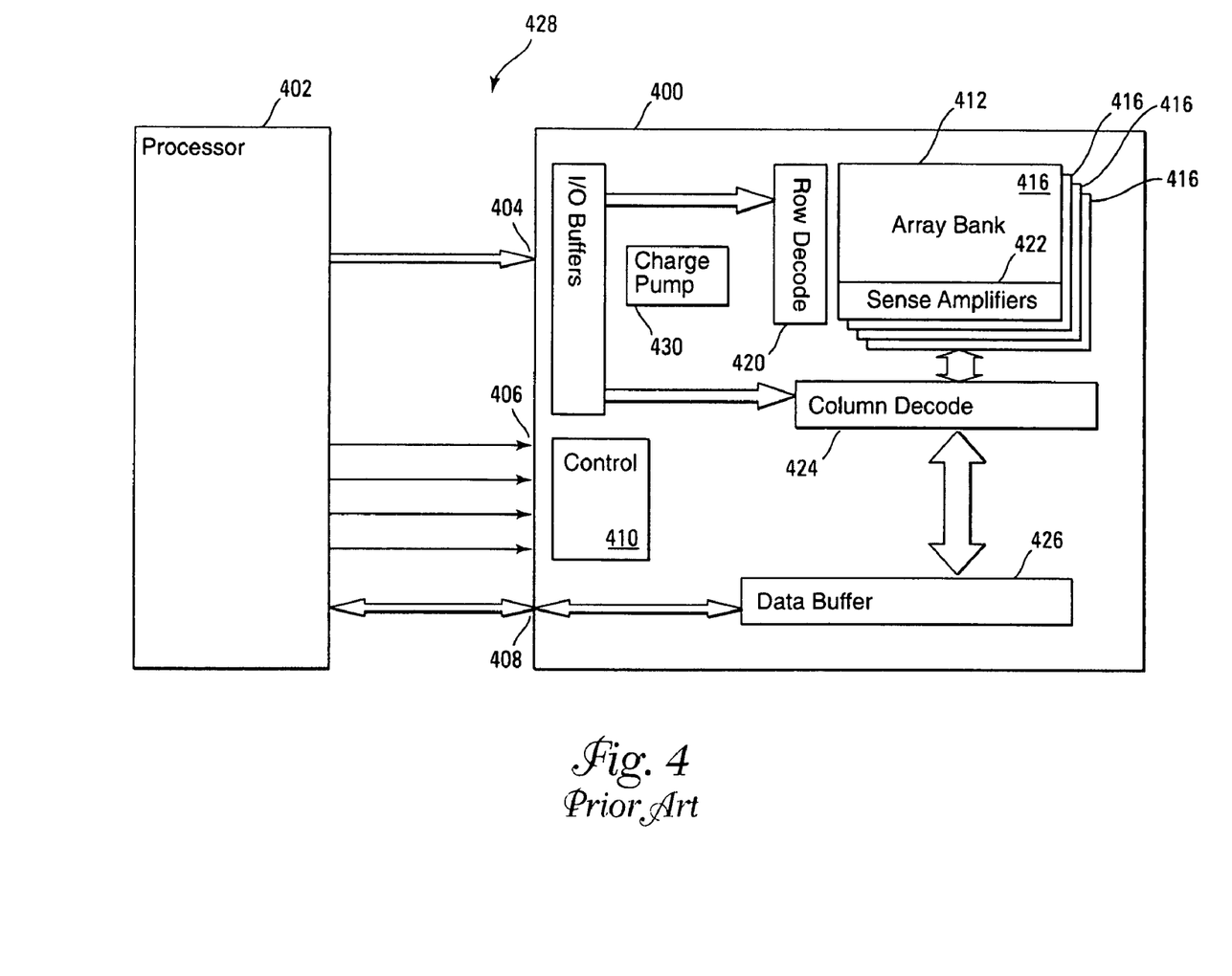
FIG. 4 is a block diagram of one integrated circuit device whose design can be aided using embodiments of the invention.

FIG. 4 is a block diagram of a typical memory device 400, such as a flash memory device, that can be designed using analog circuit simulation. Flash memory devices generally use one or more charge pumps for providing internally-generated voltages from a single supply potential. The memory device 400 has an address interface 404, a control interface 406, and a data interface 408 for coupling to a processor or other controller (not shown) to allow access to and control of the memory device 400. A control state machine 410 directs internal operation of the memory device 400, managing access to the memory array 412.

The memory array 412 may contain multiple memory banks or segments 416. For a flash memory device, each bank 416 is generally organized logically into a series of erase blocks (not shown). Memory access addresses are received on the address interface 404 of the memory device 400 and divided into a row and column address portions.

On a read access the row address is latched and decoded by row decode circuit 420, which selects and activates a row page (not shown) of memory cells across a selected memory bank 416. The bit values encoded in the output of the selected row of memory cells are coupled from a local bitline (not shown) to a global bitline (not shown) and detected by sense amplifiers 422 associated with the memory bank 416. The column address of the access is latched and decoded by the column decode circuit 424. The output of the column decode circuit selects the desired column data from the sense amplifier outputs and coupled to the data buffer 426 for transfer from the memory device 400 through the data interface 408.

On a write access the row decode circuit 420 selects the row page and column decode circuit selects write sense amplifiers 422. In programming a flash memory, a charge pump circuit 430 is first activated to provide a higher programming voltage to floating gate memory cells of the memory array 412 than the voltage supplied to operate the memory 400. Data values to be written are coupled from the data buffer 426 to the write sense amplifiers 422 selected by the column decode circuit 424 and written to the selected floating gate memory cells (not shown) of the memory array 412. The written cells are then reselected by the row and column decode circuits 420, 424 and sense amplifiers 422 so that they can be read to verify that the correct values have been programmed into the selected memory cells.

CONCLUSION

Circuit models have been described for the simulation of charge pumps to aid in the design of integrated circuits containing charge pumps. Such models facilitate accurate simulation of actual charge pump behavior without the need to rigorously simulate the multiple capacitive stages of an actual charge pump and the dedicated oscillator clocking the charge pump. The various embodiments utilize a charge pump model having multiple pull-up stages. At lower output voltages, the pull-up stages each provide an output current. These output currents are added together as the output current of the charge pump. Each pull-up stage automatically shuts off when the output voltage approaches a dedicated voltage source for that pull-up stage. As the output voltage increases, less current is output due to the deactivation of pull-up stages.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of designing an integrated circuit having a charge pump, the method comprising:
   simulating an output current and an output voltage of the charge pump using a circuit model, wherein the model comprises a plurality of pull-up stages having their outputs coupled in parallel, wherein each of the plurality of pull-up stages is associated with a threshold voltage and wherein each of the plurality of pull-up stages ceases to contribute to the simulated output current of the charge pump when the simulated output voltage of the charge pump approaches the threshold value associated with that pull-up stage; and
   using the simulated output current and output voltage to simulate a behavior of the integrated circuit device.

2. The method of claim 1, wherein each pull-up stage is associated with a different threshold value.

3. The method of claim 1, wherein each pull-up stage is a current mirror having a reference branch coupled between a voltage source and a ground node and an output branch coupled between the voltage source and an output node.

4. The method of claim 3, wherein each voltage source is associated with a different voltage.

5. The method of claim 4, wherein the threshold value for a pull-up stage is approximately equal to the voltage associated with that pull-up stage's voltage source.

6. A method of designing an integrated circuit device through analog circuit simulation, the method comprising:
   simulating the integrated circuit device using one or more circuit models, wherein at least one of the circuit models is a charge pump model, the charge pump model comprising:
      a first pull-up stage coupled to an output of the charge pump model; and
      a second pull-up stage coupled to the output of the charge pump model in parallel with the first pull-up stage;
      wherein an output current of the first pull-up stage is active while an output voltage corresponding to the output of the charge pump model is below a first value;
      wherein the output current of the first pull-up stage is inactive while the output voltage corresponding to the output of the charge pump model is above the first value;
      wherein an output current of the second pull-up stage is active while an output voltage corresponding to the output of the charge pump model is below a second value;
      wherein the output current of the second pull-up stage is inactive while the output voltage corresponding to the output of the charge pump model is above the second value;
      wherein the output currents of the first and second pull-up stages are combined for the output of the charge pump model; and
      wherein the second value of the output voltage is different than the first value of the output voltage.

7. The method of claim 6, wherein the charge pump model further comprises:
   a third pull-up stage coupled to the output of the charge pump model in parallel with the first and second pull-up stages;
   wherein an output current of the third pull-up stage is active while an output voltage corresponding to the output of the charge pump model is below a third value;
   wherein the output current of the third pull-up stage is inactive while the output voltage corresponding to the output of the charge pump model is above the third value;
   wherein the first, second and third output currents are combined for the output of the charge pump model; and
   wherein the third value of the output voltage is different than the first and second values of the output voltage.

8. The method of claim 7, wherein the charge pump model further comprises:
   at least one additional pull-up stage coupled to the output of the charge pump model in parallel with the first, second and third pull-up stages;
   wherein an output current of each at least one additional pull-up stage is active while an output voltage corresponding to the output of the charge pump model is below a value corresponding to that additional pull-up stage that is different than the first, second or third values of the output voltage;

wherein the output current of the at least one additional pull-up stage is inactive while the output voltage corresponding to the output of the charge pump model is above the value corresponding to that additional pull-up stage that is different than the first, second or third values of the output voltage; and wherein the first, second and third output currents and the output currents for each at least one additional pull-up stage are combined for the output of the charge pump model.

9. The method of claim 7, wherein a relationship between the first, second and third values of the output voltage is non-linear.

10. The method of claim 6, further comprising selectively deactivating the charge pump model while running other circuit models during the simulation of the integrated circuit.

11. A method of designing an integrated circuit device through analog circuit simulation, the method comprising:
   simulating the integrated circuit device using one or more circuit models, wherein at least one of the circuit models is a charge pump model, the charge pump model comprising:
      a plurality of pull-up stages, each pull-up stage associated with a voltage source and each voltage source associated with a voltage value;
      wherein an output current of each pull-up stage activates when a first control signal has a first logic level and a voltage at the output of that pull-up stage is less than the voltage value associated with the voltage source associated with that pull-up stage;
      wherein an output current of each pull-up stage deactivates when the first control signal has a second logic level or as a voltage at the output of that pull-up stage approaches the voltage value associated with the voltage source associated with that pull-up stage.

12. A method of designing an integrated circuit having a charge pump, the method comprising:
   simulating an output of the charge pump using a circuit model during a simulation of the integrated circuit, wherein the charge pump model comprises:
      a first pull-up stage having a first p-channel field-effect transistor (pFET), a second pFET, a third pFET and a first n-channel field-effect transistor (nFET); wherein the first pFET has a gate and a first source/drain region selectively coupled to a ground node, and a second source/drain region coupled to a first voltage source; wherein the second pFET has a gate coupled to receive a first control signal, a first source/drain region coupled to the gate of the first pFET, and a second source/drain region coupled to the first voltage source; wherein the third pFET has a gate coupled to the gate of the first pFET, a first source/drain region, and a second source/drain region coupled to the first voltage source; and wherein the first nFET has a gate coupled to the first voltage source, a first source/drain region selectively coupled to an output node, and a second source/drain region coupled to the first source/drain region of the third pFET; and
      a second pull-up stage having a first p-channel field-effect transistor (pFET), a second pFET, a third pFET and a first nFET; wherein the first pFET has a gate and a first source/drain region selectively coupled to the ground node, and a second source/drain region coupled to a second voltage source; wherein the second pFET has a gate coupled to receive the first control signal, a first source/drain region coupled to the gate of the first pFET, and a second source/drain region coupled to the second voltage source; wherein the third pFET has a gate coupled to the gate of the first pFET, a first source/drain region, and a second source/drain region coupled to the second voltage source; and wherein the first NFET has a gate coupled to the second voltage source, a first source/drain region selectively coupled to the output node, and a second source/drain region coupled to the first source/drain region of the third pFET.

13. The method of claim 12, wherein the charge pump model further comprises:
   at least one additional pull-up stage, each additional pull-up stage having a first p-channel field-effect transistor (pFET), a second pFET, a third pFET and a first nFET; wherein the first pFET has a gate and a first source/drain region selectively coupled to the ground node, and a second source/drain region coupled to a voltage source associated with that pull-up stage; wherein the second pFET has a gate coupled to receive the first control signal, a first source/drain region coupled to the gate of the first pFET, and a second source/drain region coupled to the voltage source associated with that pull-up stage; wherein the third pFET has a gate coupled to the gate of the first pFET, a first source/drain region, and a second source/drain region coupled to the voltage source associated with that pull-up stage; and wherein the first nFET has a gate coupled to the voltage source associated with that pull-up stage, a first source/drain region selectively coupled to the output node, and a second source/drain region coupled to the first source/drain region of the third pFET.

14. The method of claim 13, wherein a third voltage source corresponding to a first additional pull-up stage has a voltage of approximately 7V and the third pFET of the first additional pull-up stage is sized for producing an output current of approximately 150 µA when active, and wherein a fourth voltage source corresponding to a second additional pull-up stage has a voltage of approximately 5V and the third pFET of the second additional pull-up stage is sized for producing an output current of approximately 200 µA when active.

15. The method of claim 12, wherein the gates of the first pFETs of the pull-up stages are selectively coupled to the ground node through a second nFET.

16. The method of claim 15, wherein the second nFET is responsive to a second control signal and wherein the second control signal is received from an output of a multiplexer having a current source coupled to a first input and a ground node coupled to a second input.

17. The method of claim 15, wherein the gates of the first pFETs of the pull-up stages are each selectively coupled to the ground node through a second nFET, with one second NFET for each pull-up stage.

18. The method of claim 12, wherein the first source/drain regions of the first nFETs of the pull-up stages are selectively coupled to the output node through a third nFET.

19. The method of claim 18, wherein the third nFET is responsive to a third control signal having a logic level the same as the first control signal.

20. The method of claim 12, wherein the charge pump model further comprises a resistive element coupled between the output node and the pull-up stages.

21. The method of claim 12, wherein the charge pump model further comprises a fourth pFET coupled between a supply node and the pull-up stages.

22. The method of claim 12, further comprising adjusting the third pFETs of the pull-up stages to vary the output current of each pull-up stage.

23. The method of claim 12, wherein the first voltage source has a voltage of approximately 11.5V and the third pFET of the first pull-up stage is sized for producing an output current of approximately 200 μA when active, wherein the second voltage source has a voltage of approximately 9V and the third pFET of the second pull-up stage is sized for producing an output current of approximately 100 μA when active.

* * * * *

UNITED STATES PATENT AND TRADEMARK OFFICE
CERTIFICATE OF CORRECTION

PATENT NO. : 7,512,910 B2   Page 1 of 1
APPLICATION NO. : 11/300034
DATED : March 31, 2009
INVENTOR(S) : Liu

It is certified that error appears in the above-identified patent and that said Letters Patent is hereby corrected as shown below:

In column 10, line 6, in Claim 12, delete "NFET" and insert -- nFET --, therefor.

In column 10, line 54, in Claim 17, delete "NFET" and insert -- nFET --, therefor.

Signed and Sealed this

Thirtieth Day of June, 2009

JOHN DOLL
*Acting Director of the United States Patent and Trademark Office*